(12) United States Patent
Shimizu et al.

(10) Patent No.: US 12,315,732 B2
(45) Date of Patent: May 27, 2025

(54) METHOD AND APPARATUS FOR ETCHING A SEMICONDUCTOR SUBSTRATE IN A PLASMA ETCH CHAMBER

(71) Applicant: Applied Materials, Inc., Santa Clara, CA (US)

(72) Inventors: Daisuke Shimizu, Milpitas, CA (US); Li Ling, Santa Clara, CA (US); Hikaru Watanabe, Santa Clara, CA (US); Kenji Takeshita, Santa Clara, CA (US)

(73) Assignee: Applied Materials, Inc.

( * ) Notice: Subject to any disclaimer, the term of this patent is extended or adjusted under 35 U.S.C. 154(b) by 441 days.

(21) Appl. No.: 17/837,958

(22) Filed: Jun. 10, 2022

(65) Prior Publication Data
US 2023/0402286 A1    Dec. 14, 2023

(51) Int. Cl.
*H01L 21/3065* (2006.01)
*H01J 37/32* (2006.01)

(52) U.S. Cl.
CPC .... *H01L 21/3065* (2013.01); *H01J 37/32128* (2013.01); *H01J 37/32146* (2013.01); *H01J 37/32449* (2013.01); *H01J 2237/334* (2013.01)

(58) Field of Classification Search
None
See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report and Written Opinion from PCT/US2022/052182 dated Apr. 24, 2023.

(Continued)

*Primary Examiner* — Allan W. Olsen
(74) *Attorney, Agent, or Firm* — Patterson + Sheridan, LLP (57) ABSTRACT

Methods and apparatus for etching a substrate in a plasma etch chamber are provided. In one example, the method includes exposing a substrate disposed on a substrate supporting surface of a substrate support to a plasma within a processing chamber, and applying a voltage waveform to an electrode disposed in the substrate support while the substrate is exposed to the plasma during a plurality of macro etch cycles. Each macro etch cycle includes a first macro etch period and a second macro etch period. The macro etch period includes a plurality of micro etch cycles. Each micro etch cycle has a bias power on (BPON) period and a bias power off (BPOFF) period, wherein a duration of the BPON period being less than a duration of the BPOFF period. Bias power is predominantly not applied to the electrode during the second macro etch period.

20 Claims, 4 Drawing Sheets

(56) References Cited

U.S. PATENT DOCUMENTS

| | | |
|---|---|---|
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Surin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |

(56) References Cited

U.S. PATENT DOCUMENTS

| | | |
|---|---|---|
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |

(56) References Cited

U.S. PATENT DOCUMENTS

| | | |
|---|---|---|
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0124177 A1* | 7/2004 | Urban ............. H01J 37/32082 216/67 |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |

(56) References Cited

U.S. PATENT DOCUMENTS

| | | |
|---|---|---|
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0264841 A1 | 11/2007 | Chebi et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0168354 A1* | 7/2013 | Kanarik ............ H01J 37/32082 216/68 |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0020831 A1* | 1/2014 | Ohgoshi ............ H01J 37/32192 156/345.24 |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0072530 A1 | 3/2015 | Kim et al. |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0132971 A1 | 5/2015 | Lin et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |

(56) References Cited

U.S. PATENT DOCUMENTS

| | | |
|---|---|---|
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0134618 A1 | 5/2021 | Lubomirsky et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |

FOREIGN PATENT DOCUMENTS

| | | |
|---|---|---|
| CN | 101707186 B | 2/2012 |
| CN | 105408993 A | 3/2016 |
| CN | 105448726 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 201717247 A | 5/2017 |
| TW | 202147925 A | 12/2021 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |

(56) References Cited

FOREIGN PATENT DOCUMENTS

| | | |
|---|---|---|
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

PCT International Search Report and Written Opinion dated Nov. 9, 2018, for International Application No. PCT/US2018/043032.

Taiwan Office Action for Application No. 107125613 dated Dec. 24, 2020, 16 pages.

PCT International Search Report and Written Opinion dated Nov. 7, 2018, for International Application No. PCT/US2018/042965.

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

Semiconductor Components Industries, LLC (SCILLC)—"Switch-Mode Power Supply" Reference Manual, SMPSRM/D, Rev. 4, Apr. 2014, ON Semiconductor, 73 pages.

Sunstone Circuits—"Eagle Harbor Tech Case Study," date unknown, 4 pages.

International Search Report and Written Opinion for PCT/US2019/052067 dated Jan. 21, 2020.

Electrical 4 U webpage—"Clamping Circuit," Aug. 29, 2018, 9 pages.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

PCT Notification of Transmittal of the International Search Report and the Written Opinion of the International Searching Authority for International Application No. PCT/US2019/048392; dated Dec. 16, 2019; 13 pages.

PCT International Search Report and Written Opinion dated Nov. 7, 2018, for International Application No. PCT/US2018/042961.

PCT International Search Report and Written Opinion dated Nov. 7, 2018, for International Application No. PCT/US2018/042956.

(56) References Cited

OTHER PUBLICATIONS

U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, "Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With A DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
Taiwan Office Action dated Nov. 26, 2024 for Application No. 112100369.

* cited by examiner

METHOD AND APPARATUS FOR ETCHING A SEMICONDUCTOR SUBSTRATE IN A PLASMA ETCH CHAMBER

BACKGROUND

Field

Embodiments of the present disclosure generally relate to a system and methods used in semiconductor device manufacturing. More specifically, embodiments provided herein generally include an apparatus and methods for etching a semiconductor substrate in a plasma etch chamber.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) generator, which supplies an RF power to a power electrode, such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to the power electrode, or a separate power electrode that is disposed outside of the ESC assembly and within the processing chamber, through an RF matching network ("RF match") that tunes the apparent load to 50 Ω to minimize the reflected power and maximize the power delivery efficiency.

In high aspect ratio etch applications, it often challenging to maintain the verticality of the etched features. Asymmetries in any one of ground return paths, RF power application, pattern density, flow conductance, and substrate charging, among other, often contributes to loss of vertically (also known as tilting) of the sidewalls of the etched feature. In some cases, tilting of the sidewalls has a detrimental impact on device performance, and may even lead to device failure.

Thus, there is a need for an improved method and apparatus for plasma etching.

SUMMARY

Methods and apparatus for etching a semiconductor substrate in a plasma etch chamber are provided. In one example, the method includes exposing a substrate disposed on a substrate supporting surface of a substrate support to a plasma within a processing chamber, and applying a voltage waveform to an electrode disposed in the substrate support while the substrate is exposed to the plasma during a plurality of macro etch cycles. Each macro etch cycle includes a first macro etch period and a second macro etch period. The macro etch period includes a plurality of micro etch cycles. Each micro etch cycle has a bias power on (BPON) period and a bias power off (BPOFF) period, wherein a duration of the BPON period is less than a duration of the BPOFF period. Bias power is predominantly not applied to the electrode during the second macro etch period.

In another example, a method for etching a semiconductor substrate in a plasma etch chamber is provided that includes forming a plasma from a processing gas containing carbon and at least one halogen, exposing a dielectric layer disposed on the semiconductor substrate to the plasma within the plasma etch chamber, and applying bias power to the semiconductor substrate while exposed to the plasma during a plurality of macro etch cycles until an end point is reached. Each macro etch cycle includes a first macro etch period and a second macro etch period. The macro etch period includes a plurality of micro etch cycles. Each micro etch cycle has a bias power on period and a bias power off period. A duration of the BPON period is less than a duration of the BPOFF period. Bias power is predominantly not applied to the electrode during the second macro etch period. In at least the macro etch cycle, the bias power on period is at least two orders of magnitude less in duration than the first macro etch period, the bias power off period is at least two orders of magnitude less in duration than the second macro etch period.

In yet another example, a plasma etch chamber is provided. The plasma etch chamber includes a chamber body having an interior volume, a substrate support disposed in the interior volume of the chamber body, a bias power control system, a gas panel, and a controller. The substrate support is configured to retain a semiconductor substrate thereon during processing. The substrate support has a biasing electrode. The bias power control system is coupled to the biasing electrode. The gas panel is configured to provide a processing gas to the interior volume. The controller is configured to maintain a plasma within the plasma etch chamber formed from the processing gas, and apply bias power to the biasing electrode while the semiconductor substrate disposed on the substrate support is exposed to the plasma during a plurality of macro etch cycles. Each macro etch cycle includes a first macro etch period and a second macro etch period. The macro etch period includes a plurality of micro etch cycles. Each micro etch cycle has a bias power on period and a bias power off period. A duration of the BPON period is less than a duration of the BPOFF period. Bias power is predominantly not applied to the electrode during the second macro etch period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in semiconductor device manufacturing. More specifically, embodiments provided herein generally include apparatus and methods for etching a substrate in a plasma etch chamber in manners that reduce tilting of the vertical sidewalls of the etched features. Such improvements have been realized by modulating a waveform used to apply bias power to an electrode of a substrate support utilized to support the substrate during etching in both macro and micro regimes. In the macro regime, a plurality of macro etch cycles are utilized to etch the substrate. The waveform includes periods where the bias power is essentially stopped during a portion of each macro etch cycle to allow etch by-products to be exhausted from the plasma etch chamber. By periodically clearing the etch by-products from the chamber, etchants may more effectively be delivered to the feature being etched with a vertical trajectory. In the micro regime of the waveform, a plurality of micro etch cycles are utilized during a portion of each macro etch cycle. Each micro etch cycle includes a first period in which the bias power is on and a second period in which the bias power is essentially stopped. The duration of the second period is greater than a duration of the first period to provide time for etch by-products to exit the feature being etched (such as a hole, a trench, or the like). By periodically clearing the etch by-products from the etched feature, etchants may more effectively be delivered to the bottom of the etched feature with a vertical trajectory. The reduced number of collisions between etchants and the etch by-products enables the etchants maintain a substantially vertical trajectory all the way to the bottom of the etched feature, thus beneficially resulting in a reduced etching of the sidewalls and consequently, excellent verticality of the sidewalls of the etched feature. The enhanced verticality is particularly desirable when forming high aspect ratio features by etching.

Figure 1:
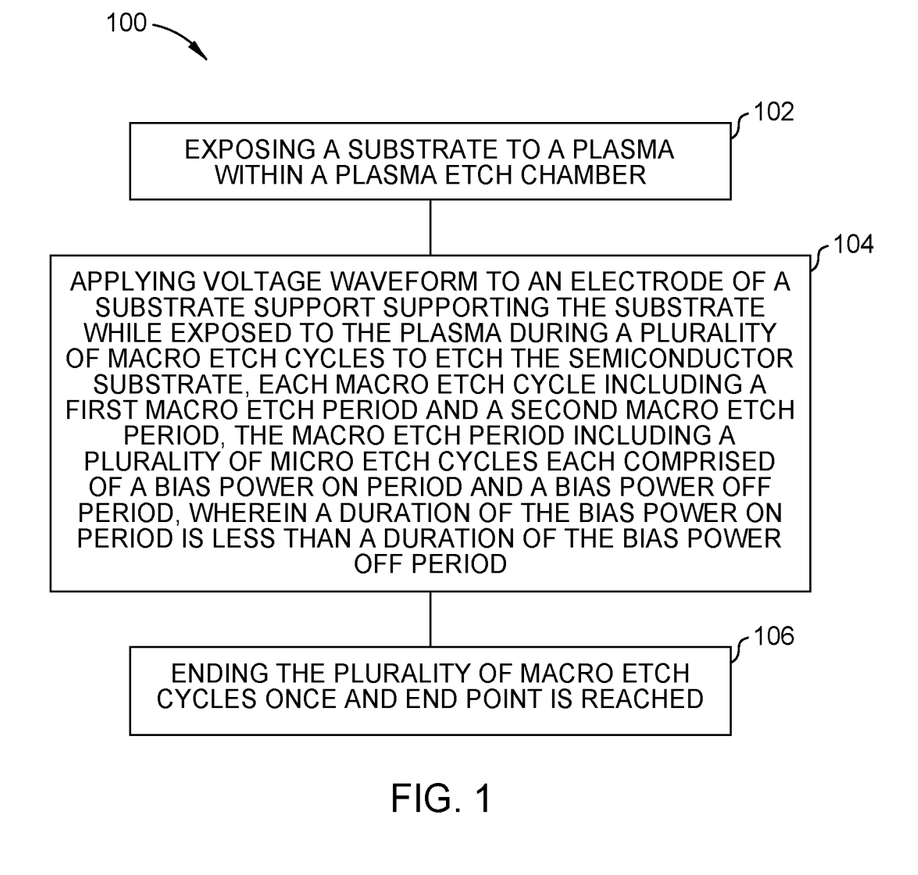
FIG. 1 is a flow diagram of one example of a method for etching a substrate.

Turning now to FIG. 1, a flow diagram of one example of a method 100 for etching a substrate is illustrated. The method 100 may be practiced in a plasma etch chamber, an example of which is later depicted in FIG. 5. The method 100 may alternatively be practiced in other suitable plasma processing chambers. The method 100 is best described with additional reference to FIGS. 2A-2D that illustrate partial sectional views of a substrate 200 during various stages of the etch method 100. The method 100 may be utilized to etch contact vias and trenches, among other features. The method 100 is particularly useful when etching high aspect ratio (height to width ratio greater than 10) features, where verticality of the etched features has a high impact on device performance.

Figure 2A:
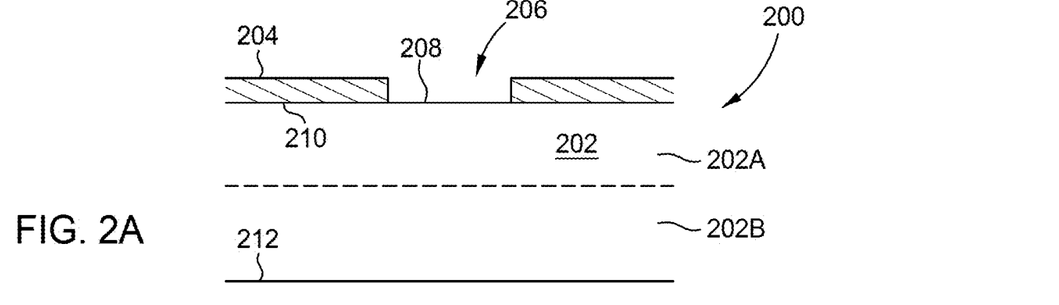
FIGS. 2A-2D are partial sectional views of a substrate during various stages of an etch process, such as but not limited to the method described with reference to FIG. 1.

The method 100 begins at operation 102 by exposing a substrate 200 disposed on a substrate supporting surface of a substrate support to a plasma within a plasma etch chamber. As depicted in FIG. 2A, the substrate 200 generally includes a patterned mask 204 disposed on a top surface 210 of a target material 202 to be etched. The mask 204 may be a photoresist, hardmask, combination thereof or other suitable mask. The patterned mask 204 includes an opening 206 that leaves a portion 208 of the top surface 210 of the target material 202 exposed to the plasma within the plasma etch chamber for etching. The substrate 200 may have one or more additional layers (not shown) disposed below a bottom surface 212 of the target material 202.

In one example, the target material 202 is a dielectric layer. For example, the target material 202 may be an oxide layer. In yet other examples, the target material 202 may be a metal or semiconductor material.

In other examples, the target material 202 may include multiple layers. In FIG. 2A, the target material 202 includes a first material 202A disposed on a second material 202B. The first material 202A and the second material 202B are different materials. For example, one of the first material 202A is an oxide layer or a nitride layer, while the second material 202B is the other of an oxide layer or a nitride layer. In still other examples, target material 202 includes a plurality of alternating oxide and nitride layer pairs.

The plasma may be formed within the plasma etch chamber, or formed remote from and delivered into the plasma etch chamber. The plasma is generally formed from a process gas suitable for etching the target material 202. For example when the target material 202 is a dielectric material, the processing gas may comprise a carbon and halogen containing gas. Examples of suitable carbon and halogen containing gases include variants of $C_XH_YF_Z$, wherein X, Y and Z are integers. Other examples of suitable carbon and halogen containing gases include variants of $C_XF_Z$, wherein X and Z are integers. In still other examples wherein the target material 202 includes one or more metals, the processing gas may comprise Cl and/or oxygen. In still other examples wherein the target material 202 is silicon, the processing gas may comprise Cl and/or fluorine, such as carbon tetrachloride ($CCl_4$), trifluoromethane ($CHF_3$), and the like. In any of the above examples, one or more polymer cleaning gases (such as O2, N2, NF3, etc.) and/or one or more inert gases (such as He, Ar, Kr etc.) may optionally be provided as part of the process gas.

Figure 2B:
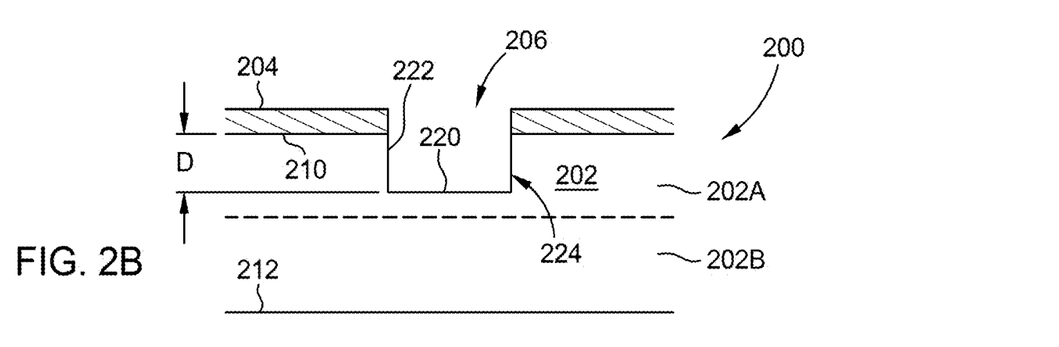

At operation 104, a voltage waveform is applied to an electrode disposed in the substrate support while the substrate 200 is exposed to the plasma during a plurality of macro etch cycles to etch the substrate 200, as depicted in FIG. 2B. Each macro etch cycle including a first macro etch period and a second macro etch period. The first macro etch period is generally is used to etch the portion 208 of the target material 202 of the substrate 200 that is exposed through the opening 206 in of the patterned mask 204. Each macro etch cycle may be milliseconds in duration. Within macro etch cycle, the first macro etch period is generally longer than the second macro etch period. For example, the first macro etch period may be three times or longer than the second macro etch period.

During the first macro etch period, the voltage waveform includes a plurality of micro etch cycles. Each micro etch cycle may be microseconds in duration. Thus, the duration of macro etch period is generally an order of magnitude more, for example, 2 to 3 or more orders of magnitude more, than the duration of the micro etch cycle.

Each micro etch cycle includes of a bias power on period and a bias power off period. During the bias power on period, DC power is applied to the electrode disposed in the substrate support. During the bias power off period, DC power is predominately not applied to the electrode disposed in the substrate support, where predominately not applying DC power is defined as not applying DC power from a DC power source coupled to the electrode between zero and 10 percent of the duration of the bias power off period. In one example, essentially no DC power is applied to the electrode disposed in the substrate support for the entire duration of the bias power off period.

The DC power applied to the electrode during the bias power on period effectively directs etchants from the plasma vertically into the feature 224 to etch the exposed portion 208 of the target material 202. Similarly, with DC power predominantly not applied to the electrode during the bias power off period, the target material 202 of the substrate 200 is not etched, thus allowing etch by-products to exit the etched feature 224. Advantageously, as the bias power off period allows the etch by-products to be substantially removed from feature 224, the DC power applied in next bias power on period allows etchants to be directed vertically to the bottom 220 of the etched feature 224 with reduced probability of collision with by-products in feature 224 resulting in the bottom 220 of the feature being vertically etch with little etching of the sidewalls 222 of the feature 224. The reduced etching of the sidewalls 222 of the feature 224 beneficially results in a high degree of verticality of the sidewalls 222.

Similarly during the second macro etch period, DC power is predominately not applied to the electrode disposed in the substrate support, such that DC power is applied from a DC power source coupled to the electrode between zero and 10 percent of the duration of the second macro etch period. In one example, essentially no DC power is applied to the electrode disposed in the substrate support for the entire duration of the second macro etch period.

As with the bias power off period of the second micro etch cycle where DC power predominantly not applied to the electrode, during the second macro etch period the target material 202 of the substrate 200 is also not etched. The millisecond duration of the second macro etch period allows etch by-products, that have exited from etched feature 224 during the bias power off periods of the previously completed first macro etch cycle, to be removed from the region directly above the substrate 200 and pumped out of the plasma etch chamber. With the etch by-products removed from the region directly above the substrate 200, the next macro etch cycle may be performed with a reduced number of collisions between residual etch by-products and the etchant being directed into the feature 224, thus further enhancing the verticality the etched feature 224. By comparison, the duration of the second macro etch period is 100 to 1000 or more times longer than the duration of the second micro etch period, as more time is needed to pump out by-products from the chamber as compared to pumping out by-products from the feature 224.

The macro etch cycles are repeated until an endpoint is reached at operation 106 when a depth of the etched feature 224 reaches a predefined depth D. As illustrated in FIG. 2B, the endpoint of the process for etching the target material 202 at a depth D that does not break through the target material 202. The endpoint of the process for etching the target material 202 may be determined by monitoring optical spectra of the plasma composition, interferometry, or timed etch, among other techniques.

Figure 2C:
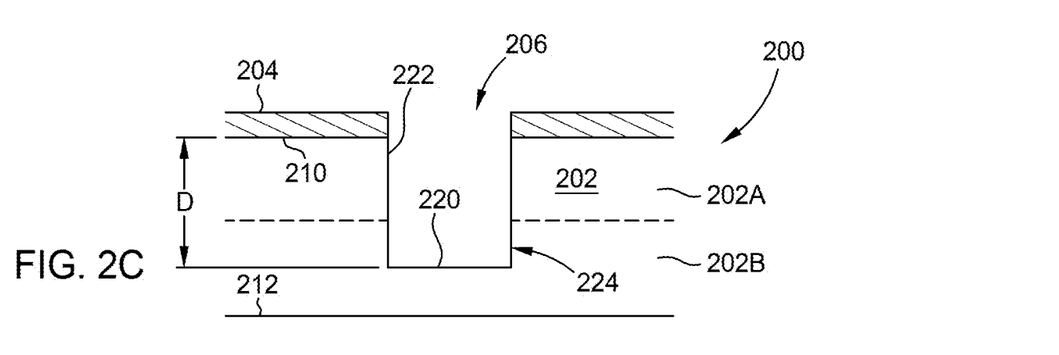
Figure 2D:
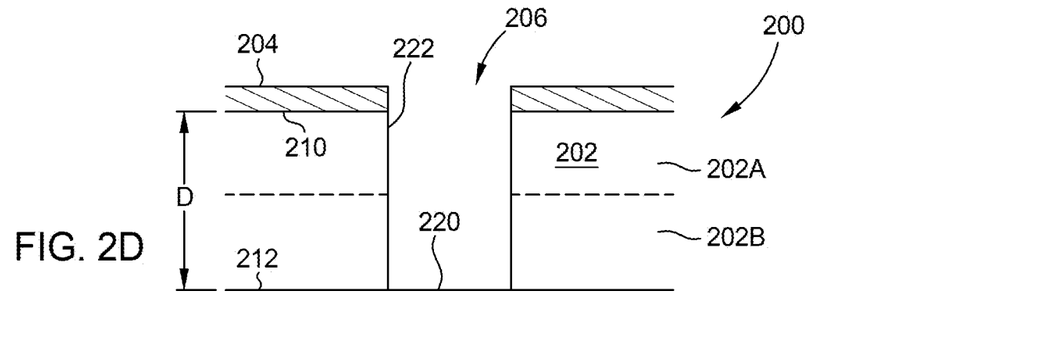

In some examples where the target material 202 includes multiple layers, such as a first material 202A disposed on a second material 202B, the endpoint depth D may be beyond the thickness of the first material 202A but does not break through the second material 202B, as illustrated in FIG. 2C. In still other examples where the target material 202 includes a single layer or multiple layers, the depth D at each the endpoint is reached is when the etched feature 224 breaks through the target material 202 such that the bottom 220 of the feature 224 is defined by the layer (not shown) underlying the target material 202, as illustrated in FIG. 2D.

Figure 3:
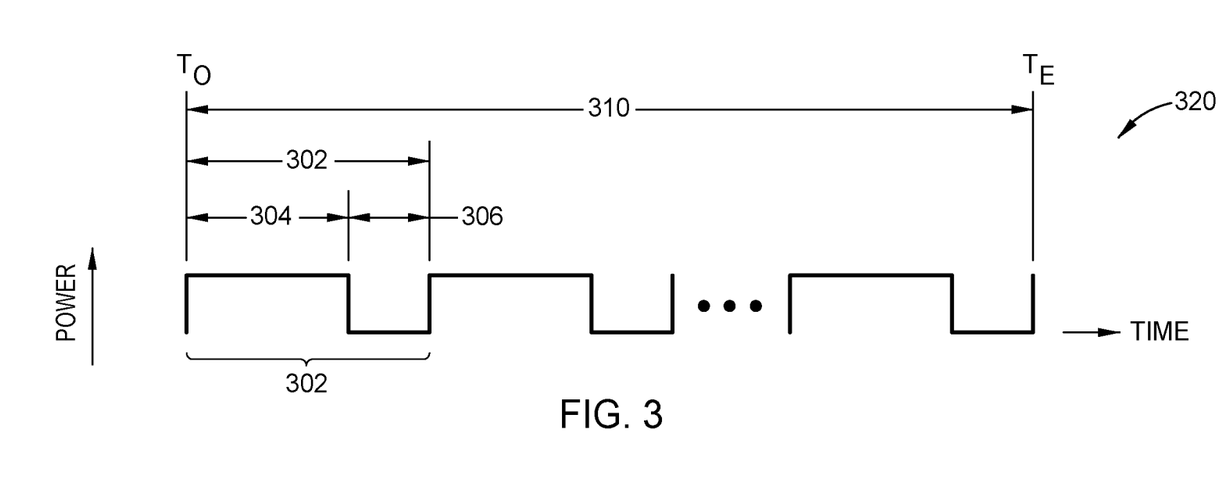
FIG. 3 is one example of a bias power timing diagram illustrating a plurality of macro etch cycles utilized to reach an endpoint during performance of a method for etching a substrate.

FIG. 3 is one example of a bias power timing diagram illustrating a waveform 320 that comprises a plurality of macro etch cycles 302 utilized to reach an endpoint at time (TE) during performance of a method for etching a substrate 200, such as the method 100 described above or other similar etch process. Although not illustrated in FIG. 3, the last of the plurality of macro etch cycles 302 may be truncated upon reaching the endpoint at time (TE), for example at operation 106 described above. In the bias power timing diagram depicted in FIG. 3, the vertical axis is representative of DC power applied to the electrode disposed in the substrate support, while the horizontal axis is representative of time. A duration 310 of the entire etch process to reach the endpoint depth D extends from time (To) to the endpoint at time (TE).

Each macro etch cycle 302 generally has, but is not limited to, a duration of 1 to 250 milliseconds. As discussed above, each macro etch cycle 302 includes a first macro etch period 304 and a second macro etch period 306. Although not required, the first macro etch period 304 occurs prior to the second macro etch period 306. The first macro etch period 304 has a duration longer than a duration of the second macro etch period 306. In one example, the first macro etch period 304 has a duration that is at least percent of the total duration of the macro etch cycle 302. In another example, the first macro etch period 304 has a duration that is at least 80 percent of the total duration of the macro etch cycle 302. In one example, the duration of the second macro etch period 306 is selected to be sufficient enough to pump out most of the etch by-products in the process volume above the substrate support.

In some examples, the amount of etch by-products in the process volume above the substrate support may change at different times over the duration 310 of the entire etch process. For example, as the etched feature 224 becomes deeper, the mount the amount of etch by-products in the process volume above the substrate support per unit time may diminish. As such the ratio of the duration of the first macro etch period 304 to the second macro etch period 306 may increase over the course of the duration 310, particularly closer to the endpoint at time (TE). Alternatively, the ratio of the duration of the first macro etch period 304 to the second macro etch period 306 may be different etching the first material 202A as compared to etching the second material 202B.

The frequency of the macro etch cycles 302 is generally in a single to hundreds of Hz range. For example, the frequency of the macro etch cycles 302 may be, but is not limited to, about 5 Hz to about 100 Hz. The frequency of the macro etch cycle 302 may be constant or change over the entire duration 310 for etching of the feature 224. For example, the frequency of the macro etch cycle 302 may be higher during portions of the waveform 320 closer to $T_0$ than portions of the waveform 320 closer to TE. It has been demonstrated that using lower frequency macro etch cycles 302 at deeper depths D improves verticality of the sidewalls 222 of the etched feature 224 by allowing more time for by-product removal from the etch chamber between active etching of the target materials 202. Alternatively, the frequency of the macro etch cycle 302 may be higher or lower at different portions of the duration 310 of the etch method 100.

As illustrated in FIG. 3, the DC power is predominantly not applied to the electrode of the substrate support during the second macro etch period 306.

Referring back to the first macro etch period 304, the first macro etch period 304 includes times in which DC power is applied to the electrode disposed in the substrate support that supports the substrate within the plasma etch chamber. Etch if the target material 202 generally occurs when DC power is applied to the electrode, but not when the DC power to the electrode is off. The DC power is cyclically applied to the electrode during the first macro etch period 304, as further described below with reference to FIG. 4.

Figure 4:
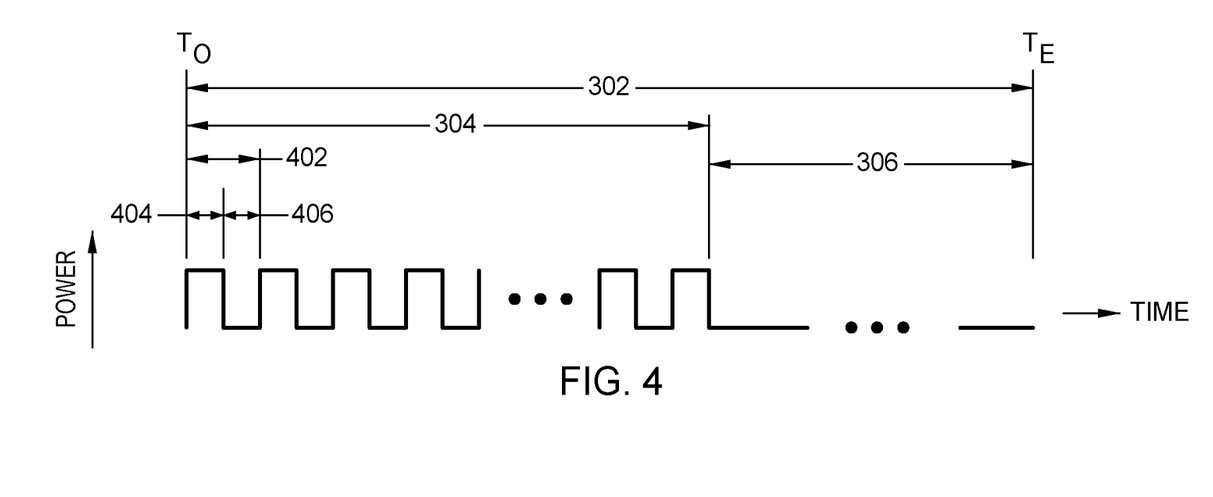
FIG. 4 is one example of a bias power timing diagram further detailing one macro etch cycle.

FIG. 4 is one example of a bias power timing diagram further detailing one macro etch cycle 302. In FIG. 4, the vertical axis is representative of DC power applied to the electrode disposed in the substrate support, while the horizontal axis is representative of time. Each macro etch cycle 302 (one of which is shown in FIG. 4) includes a single first macro etch period 304 and a single second macro etch period 306. Each first macro etch period 304 includes a plurality of micro etch cycles 402. Each micro etch cycle 402 includes a first micro etch period 404 and a second micro etch period 406.

As described above, the first macro etch period 304 is generally is used to etch the portion 208 of the target material 202 of the substrate 200 that is exposed through the opening 206 in of the patterned mask 204. To enable etching during each first macro etch period 304, bias power is provided to the electrode of the substrate support during each of the first macro etch periods 404. As the first micro etch periods 404 are milliseconds in duration, bias power is applied to the electrode of the substrate support for many first micro etch periods 404 that comprise each first macro etch period 304 to effectively etch the target material 202.

The frequency of bias power on periods (e.g., DC power pulses) of the micro etch cycle 402 is generally in single to hundreds of kHz range. For example, the frequency of the micro etch cycles 402 may be, but is not limited to, about 25 kHz to about 600 kHz, for example 25 kHz to about 500 kHz. The frequency of the micro etch cycles 402 may be constant or change over the duration of the macro etch cycle 302, and/or may be constant or change over the duration 310 of the etching of the feature 224. For example, the frequency of the micro etch cycles 402 may be higher during portions of the waveform 320 closer to $T_0$ than portions of the waveform 320 closer to TE. It has been demonstrated that using lower frequency micro etch cycles 402 at deeper depths D improves verticality of the sidewalls 222 of the etched feature 224 by allowing more time for by-products to escape high aspect ratio features 224 between active etching of the target materials 202 during each first micro etch period 404. Alternatively, the frequency of the micro etch cycle 402 may be higher or lower at different portions of the duration 310 of the etch method 100 to suit other needs.

During the micro etch cycle 402, the voltage waveform 320 includes a first micro etch period 404 and a second micro etch period 406. The first micro etch period 404 corresponds to a bias power on period while the second micro etch period 406 corresponds to a bias power off period. During the bias power on period of the first micro etch period 404, DC power is applied to the electrode disposed in the substrate support. During the bias power off period of the second micro etch period 406, DC power is predominately not applied to the electrode disposed in the substrate support, where predominately not applying DC power is defined as not applying DC power from a DC power source coupled to the electrode between zero and 10 percent of the duration of the bias power off period. In one example, essentially no DC power is applied to the electrode disposed in the substrate support for the entire duration of the bias power off period.

Thus with DC power applied to the electrode during the first micro etch period 404, the portion 208 of the target material 202 of the substrate 200 that is exposed through the opening 206 is effectively etched as the bias power directs etchants from the plasma into the feature 224 being etched in the target material 202. Similarly, with DC power predominantly not applied to the electrode during the second micro etch period 406, the target material 202 of the substrate 200 is not etched, thus allowing etch by-products to exit the etched feature 224. Advantageously as the second micro etch period 406 (i.e., bias power off) allows the etch by-products to be substantially removed from feature 224, the DC power applied in next first micro etch period 404 allows etchants to be directed vertically to the bottom 220 of the etched feature 224 with reduced probability of collision with by-products in feature 224. The reduction in by-products collision results in the bottom 220 of the feature being vertically etch with little etching of the sidewalls 222 of the feature 224. The reduced etching of the sidewalls 222 of the feature 224 beneficially results in a high degree of verticality of the sidewalls 222.

Similar to the second macro etch period 306, DC power is predominately not applied to the electrode disposed in the substrate support during the second micro etch period 406. DC power is predominately not applied from a DC power source to the electrode when DC power is not applied between zero and 90 percent of the duration of the second micro etch period 406. In one example, essentially no DC power is applied to the electrode disposed in the substrate support for the entire duration of the second micro etch period 406.

Providing sufficient time for the by-products to be removed from the feature 224 enhances the ability to achieve very vertical sidewalls 222. As such, the first micro etch period 404 has a duration that is generally less than a duration of the second micro etch period 406. In one example, the first micro etch period 404 has a duration that is generally less than 45 percent of the duration of the micro etch cycle 402, for example less than 30 percent. In another example, the first micro etch period 404 has a duration that is generally about 10 to about 45 percent of the duration of the micro etch cycle 402, for example less than 10 to about 15 percent. In another example, the BPON period of one of the micro etch cycles is less than 45% of the BPOFF period. In yet another example, the BPON period of one of the micro etch cycles is between about 10% and about 45% of the BPOFF period. Additionally, as the time needed to clear the feature 224 of etch by-products may be different at different micro etch cycles 402 within the same first macro etch period 304, or between different first macro etch periods 304, the ratio of the duration of the first micro etch period 404 to the second micro etch period 406 may decrease, increase or be constant over the course of the duration 310 of the etch method 100, particularly decreasing closer to the endpoint at time (TE). Alternatively, the ratio of the duration of the first micro etch period 404 to the duration of the second micro etch period 406 may be different etching the first material 202A as compared to etching the second material 202B. In addition or as an alternative to adjusting the duration ratio between first micro etch period 404 to the second micro etch period 406, the power applied to the bias electrode used to etch the feature 224 in the target material 202 may be different at different micro etch cycles 402 within the same first macro etch period 304, or between different first macro etch periods 304. For example, the power used during different micro etch cycles 402 may decrease, increase, or be modulated within the same first macro etch period 304 and/or within different first macro etch periods 304 over the duration 310 of the etch method 100. As an example, the power applied to the bias electrode during a first micro etch period 404 used to etch the first material 202A may be different than the power during a first micro etch period 404 used to etch the second material 202B.

Figure 5:
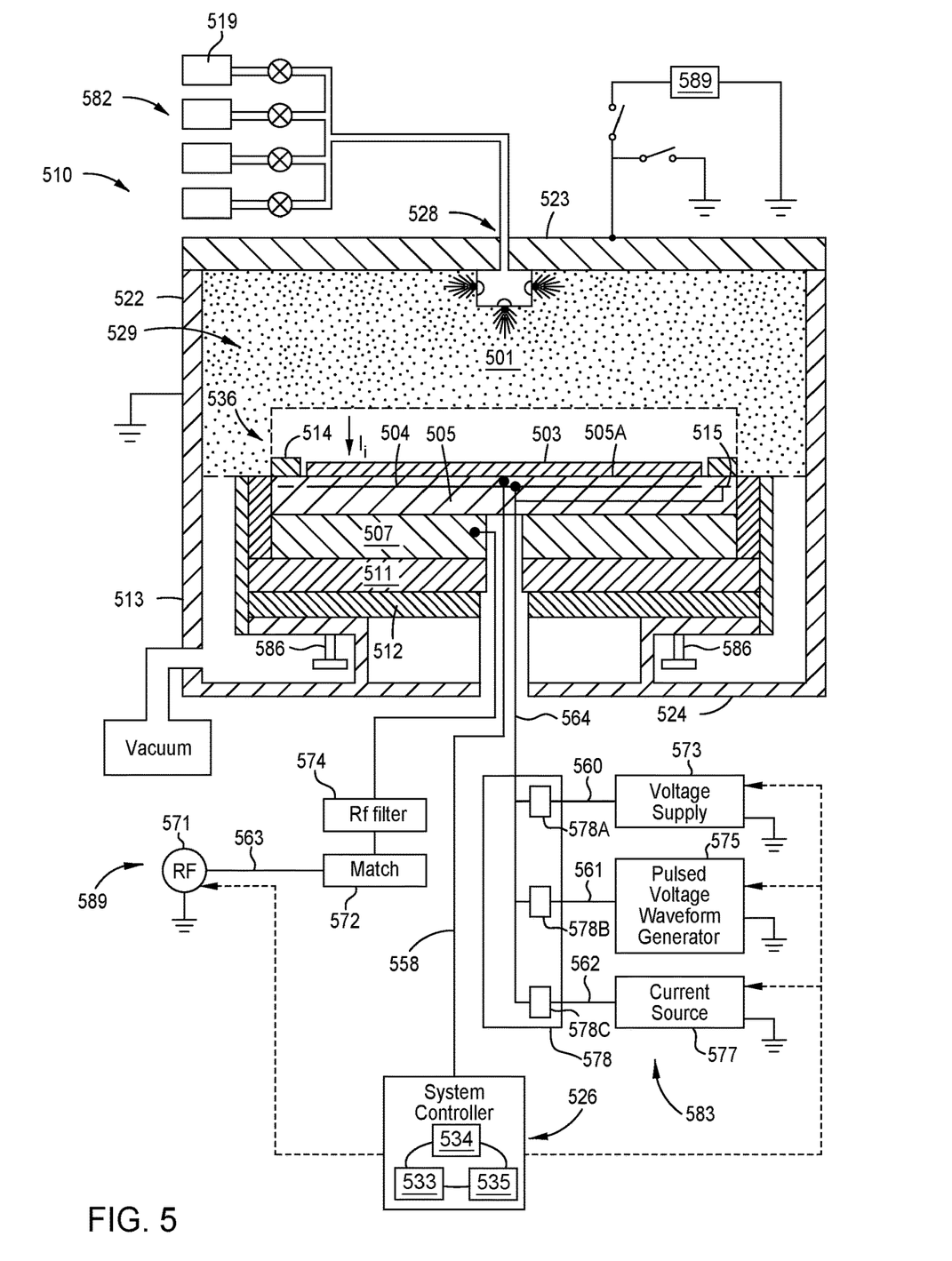
FIG. 5 is a schematic cross-sectional view of an exemplary plasma etch chamber configured to practice the methods described herein.

FIG. 5 is a schematic cross-sectional view of an exemplary plasma etch chamber 510 configured to practice the methods described above, such as the method 100 and the like. In some embodiments, the plasma etch chamber 510 is configured for plasma-assisted etching processes, such as a reactive ion etch (RIE) plasma processing. The plasma etch chamber 510 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 5, the plasma etch chamber 510 is configured to form a capacitively coupled plasma (CCP). However, in some embodiments, a plasma may alternately be generated by an inductively coupled source disposed over the processing region of the plasma etch chamber 510. In this configuration, a coil may be placed on top of a ceramic lid (vacuum boundary) of the plasma etch chamber 510. It is also contemplated that the method 100 described above may be practiced in other types of plasma etch chambers.

The plasma etch chamber 510 includes a chamber body 513, a substrate support assembly 536, a gas panel 582, a DC power system 583, an RF power system 589, and a system controller 526. The chamber body 513 includes a chamber lid 523, one or more sidewalls 522, and a chamber base 524. The chamber lid 523, one or more sidewalls 522, and the chamber base 524 collectively define the processing volume 529. A substrate 503 is loaded into, and removed from, the processing volume 529 through an opening (not shown) in one of the sidewalls 522. The substrate 503 is the same as the substrate 200 described above. The opening is sealed with a slit valve (not shown) during plasma processing of the substrate 503.

A gas panel 582, which is coupled to the processing volume 529 of the plasma etch chamber 510, includes a processing gas panel 519 and a gas inlet 528 disposed through the chamber lid 523. The gas inlet 528 is configured to deliver one or more processing gases to the processing volume 529 from the plurality of processing gas panel 519. Exemplary processing gases have been described above.

The plasma etch chamber 510 further includes an upper electrode (e.g., a chamber lid 523) and a lower electrode (e.g., a substrate support assembly 536) disposed in a processing volume 529. The upper electrode and lower electrode are positioned to face each other. As seen in FIG. 5, in one embodiment, a radio frequency (RF) source is electrically coupled to the lower electrode. The RF source is configured to deliver an RF signal to ignite and maintain a plasma (e.g., the plasma 501) between the upper and lower electrodes. In some alternative configurations, the RF source can also be electrically coupled to the upper electrode. For example, the RF source can be electrically coupled to the chamber lid. In another example, the RF source could also be electrically coupled to the support base 507.

The substrate support assembly 536 includes a substrate support 505, a substrate support base 507, an insulator plate 511, a ground plate 512, a plurality of lift pins 586, and a bias electrode 504. Each of the lift pins 586 are disposed through a through hole 585 formed in the substrate support assembly 536 and are used to facilitate the transfer of a substrate 503 to and from a substrate support surface 505A of the substrate support 505. The substrate support 505 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 507 is formed of a conductive material. The substrate support base 507 is electrically isolated from the chamber base 524 by the insulator plate 511, and the ground plate 512 interposed between the insulator plate 511 and the chamber base 524. In some embodiments, the substrate support base 507 is configured to regulate the temperature of both the substrate support 505, and the substrate 503 disposed on the substrate support 505 during substrate processing. In some embodiments, the substrate support base 507 includes one or more cooling channels (not shown) disposed therein that are fluidly coupled to, and in fluid communication with, a coolant source (not shown), such as a refrigerant source or substrate source having a relatively high electrical resistance. In other embodiments, the substrate support 505 includes a heater (not shown) to heat the substrate support 505 and substrate 503 disposed on the substrate support 505.

A bias electrode 504 is embedded in the dielectric material or otherwise coupled to the substrate support 505. Typically, the bias electrode 504 is formed of one or more electrically conductive parts. The electrically conductive parts typically include meshes, foils, plates, or combinations thereof. The bias electrode 504 may function as a chucking pole (i.e., electrostatic chucking electrode) that is used to secure (e.g., electrostatically chuck) the substrate 503 to the substrate support surface 505A of the substrate support 505. In general, a parallel plate like structure is formed by the bias electrode 504 and a layer of the dielectric material that is disposed between the bias electrode 504 and the substrate support surface 505A. The layer of dielectric material may be aluminum nitride (AlN), aluminum oxide ($Al_2O_3$), or other suitable material.

The bias electrode 504 is electrically coupled to a clamping network, which provides a chucking voltage thereto. The clamping network includes a DC voltage supply 573 (e.g., a high voltage DC supply) that is coupled to a filter 578A of the filter 578 that is disposed between the DC voltage supply 573 and bias electrode 504. In one example, the filter 578A is a low-pass filter that is configured to block RF frequency and pulsed voltage (PV) waveform signals (e.g., the waveform 320) provided by other biasing components found within the plasma etch chamber 510 from reaching the DC voltage supply 573 during plasma processing. In one configuration, the static DC voltage is between about −5000V and about 5000V, and is delivered using an electrical conductor (such as a coaxial power delivery line 560). In some embodiments, the bias electrode 504 can also bias the substrate 503 with respect to the plasma 501 using one or more of the pulsed-voltage biasing schemes described in further detail below.

In some configurations, the substrate support assembly 536, further includes an edge control electrode 515. The edge control electrode 515 is positioned below the edge ring 514 and surrounds the bias electrode 504 and/or is disposed a distance from a center of the bias electrode 504. In general, for a plasma etch chamber 510 that is configured to process circular substrates, the edge control electrode 515 is annular in shape, is made from a conductive material, and is configured to surround at least a portion of the bias electrode 504. As seen in FIG. 5, one or both of the bias electrode 504 and the edge control electrode 515 is positioned within a region of the substrate support 505, and is biased with the waveform 320 by use of a pulsed voltage (PV) waveform generator 575. In one configuration, the edge control electrode 515 is biased by use of a PV waveform generator that is different from the PV waveform generator 575 used to bias electrode 504. In another configuration, the edge control electrode 515 is biased by splitting part of the signal provided from the PV waveform generator 575 to the bias electrode 504.

The DC power system 583 includes the DC voltage supply 573, the pulsed voltage (PV) waveform generator 575, and a current source 577. The RF power system 589 includes a radio frequency (RF) waveform generator 571, match 572, and a filter 574. As previously mentioned, the DC voltage supply 573 provides a constant chucking voltage, while the RF waveform generator 571 delivers an RF signal to the processing region, and the PV waveform generator 575 establishes a PV waveform (such as the waveform 320) at the bias electrode 504. Applying a sufficient amount of RF power to an electrode, such as the substrate support base 507, cause the plasma 501 to be formed in the processing volume 529 of the plasma etch chamber 510.

In some embodiments, the power system 583 further includes a filter assembly 578 to electrically isolate one or more of the components contained within the power system 583. As shown in FIG. 5, a power delivery line 563 electrically connects the output of the RF waveform generator 571 to an impedance matching circuit 572, an RF filter 574 and substrate support base 507. Power delivery line 560 electrically connects the output of the voltage supply 573 to a filter assembly 578. Power delivery line 561 electrically connects the output of the PV waveform generator 575 to the filter assembly 578. Power delivery line 562 connects the output of the current source 577 to the filter assembly 578. In some embodiments, the current source 577 is selectively coupled to the bias electrode 504 by use of a switch (not shown) disposed in the delivery line 562, so as to allow the current source 577 to deliver a desired current to the bias electrode 504 during one or more stages (e.g., ion current stage) of the voltage waveform generated by the PV waveform generator 575. As seen in FIG. 5, the filter assembly 578, which can include multiple separate filtering components (i.e., discrete filters 578A-178C) that are each electrically coupled to the output node via power delivery line 564.

The system controller 526, also referred to herein as a processing chamber controller, includes a central processing unit (CPU) 533, a memory 534, and support circuits 535. The system controller 526 is used to control the process sequence (e.g., the method 100) used to etch the substrate 503. The CPU is a general-purpose computer processor configured for use in an industrial setting for controlling the processing chamber and sub-processors related thereto. The memory 534 described herein, which is generally non-volatile memory, can include random access memory, read-only memory, hard disk drive, or other suitable forms of digital storage, local or remote, and can be used to story computer readable instructions for enabling the method 100 to be performed by the plasma etch chamber 510. The support circuits 535 are conventionally coupled to the CPU 533 and comprises cache, clock circuits, input/output subsystems, power supplies, and the like, and combinations thereof. Software instructions (program) and data can be coded and stored within the memory 534 for instructing a processor within the CPU 533. A software program (or computer instructions) readable by CPU 533 in the system controller 526 determines which tasks are performable by the components in the plasma etch chamber 510, such as performing the method 100 to etch the substrate 200 in the manner described above.

Typically, the program, which is readable by the CPU 533 in the system controller 526 includes code, which, when executed by the CPU 533, performs tasks relating to the plasma processing method 100 described herein. The program may include instructions that are used to control the various hardware and electrical components within the plasma etch chamber 510 to perform the various process tasks and various process sequences used to implement the methods described herein. As such, in operation the plasma etch chamber 510 performs the method 100 to each the substrate 200 in a manner that produces excellent verticality of the sidewalls 222 of the etched feature 224.

In one example of the etch method 100 performed in the exemplary plasma etch chamber 510, a substrate 200 disposed on a substrate supporting surface of substrate support 505 to a plasma disposed within the etch chamber 510. The substrate includes a target layer to be etched. In one example, the target layer is a dielectric material, such an oxide or nitride. A voltage waveform to an electrode (e.g., the bias electrode 504) disposed in the substrate support 505 while the substrate is exposed to the plasma during a plurality of macro etch cycles. The plasma is formed from a processing gas suitable for etching the target layer as described above. For example when etching a dielectric target material, such as an oxide material or nitride material processing gas one or both of CxFz and CxHyFz, wherein x, y and z are integers.

In the presence of the plasma in the chamber above the substrate, the target material is etched using a waveform having plurality of macro etch cycles, wherein each macro etch period includes a plurality of micro etch cycles. Each micro etch cycle has a bias power on period and a bias power off period, where a duration of the bias power on period is less than a duration of the bias power off period. The macro etch cycles are repeated until an endpoint is reached. Once the endpoint is reached, the plasma is extinguished, the flow of processing gases into the chamber is halted, and the etched substrate is removed from the plasma etch chamber.

Thus, methods and apparatus for etching a substrate in a plasma etch chamber have been disclosed that reduce tilting of the vertical sidewalls of the etched features compared to conventional techniques. The novel etch method leverages a waveform used to apply bias power to an electrode of a substrate support utilized to support the substrate during etching in both macro and micro regimes. In the macro regime, a plurality of macro etch cycles are utilized to etch the substrate. The waveform includes periods where the bias power is essentially stopped during a portion of each macro etch cycle to allow etch by-products to be exhausted from the plasma etch chamber. By periodically clearing the etch by-products from the chamber, etchants may more effectively be delivered to the feature being etched with a vertical trajectory. In the micro regime of the waveform, a plurality of micro etch cycles are utilized during a portion of each macro etch cycle. Each micro etch cycle includes a first period in which the bias power is on and a second period in which the bias power is essentially stopped. The duration of the second period is greater than a duration of the first period to provide time for etch by-products to exit the feature being etched (such as a hole, a trench, or the like). By periodically clearing the etch by-products from the etched feature, etchants may more effectively be delivered to the bottom of the etched feature with a vertical trajectory. The reduced number of collisions between etchants and the etch by-products enables the etchants maintain a substantially vertical trajectory all the way to the bottom of the etched feature, thus beneficially resulting in a reduced etching of the sidewalls and consequently, excellent verticality of the sidewalls of the etched feature. The enhanced verticality is particularly desirable when forming high aspect ratio features by etching.

While the forgoing is directed to embodiments of the present disclosure, other and further embodiments of the disclosure may be devised without departing from the basic scope thereof, and the scope thereof is determined by the claims that follow.

What is claimed is:

1. A method for etching a substrate in a plasma etch chamber, the method comprising:
    exposing the substrate disposed on a substrate supporting surface of a substrate support to a plasma within the processing chamber; and
    applying a voltage waveform to an electrode disposed in the substrate support while the substrate is exposed to the plasma during a plurality of macro etch cycles, each macro etch cycle including a first macro etch period and a second macro etch period, the macro etch period comprises a plurality of micro etch cycles, each micro etch cycle having a bias power on (BPON) period and a bias power off (BPOFF) period, a duration of the BPON period being less than a duration of the BPOFF period, and bias power predominantly not applied to the electrode during the second macro etch period.

2. The method of claim 1, wherein the BPON period of one of the micro etch cycles is less than 45% of the BPOFF period.

3. The method of claim 1, wherein the BPON period of one of the micro etch cycles is between about 10% and about 45% of the BPOFF period.

4. The method of claim 1, wherein the plurality of macro etch cycles includes a first macro etch cycle occurring prior to a second macro etch cycle, and wherein a BPON period of one of the micro etch cycles of the first macro etch cycle is greater than a BPON period of one of the micro etch cycles of the second macro etch cycle.

5. The method of claim 1, wherein a frequency of the macro etch cycles of the plurality of macro etch cycles decreases as the substrate is etched.

6. The method of claim 1, wherein the frequency of the macro etch cycles is between about 2 to about 100 Hz.

7. The method of claim 1, wherein a frequency of the micro etch cycles is between about 25 to about 500 KHz.

8. The method of claim 7, wherein the frequency of the macro etch cycles is between about 2 to about 100 Hz.

9. The method of claim 1, wherein each micro etch cycle is at least an order of magnitude less than the macro etch cycle.

10. The method of claim 1 further comprising:
    forming the plasma from a processing gas comprising carbon and at least one halogen.

11. The method of claim 10, wherein a dielectric material is removed from the substrate during the BPON period.

12. The method of claim 11, wherein the dielectric material is an oxide material, nitride material, or a stack of oxide and nitride layer pairs.

13. The method of claim 11, wherein the dielectric material includes at least one oxide layer and at least one nitride layer.

14. The method of claim 11, wherein the processing gas one or both of $C_xF_z$ and $C_xH_yF_z$, wherein x, y and z are integers.

15. A method for etching a substrate in a plasma etch chamber, the method comprising:
    forming a plasma from a processing gas containing carbon and at least one halogen;
    exposing a dielectric layer disposed on the substrate to the plasma within the plasma etch chamber; and
    applying bias power to an electrode disposed in a substrate support supporting the substrate within the plasma etch chamber while exposed to the plasma during a plurality of macro etch cycles until an end point is reached, each macro etch cycle including a first macro etch period and a second macro etch period, the macro etch period comprises a plurality of micro etch cycles, each micro etch cycle having a bias power on (BPON) period and a bias power off (BPOFF) period, a duration of the BPON period being less than a duration of the BPOFF period, bias power predominantly not applied to the electrode during the second macro etch period, wherein in at least macro etch cycle:
    the BPON period is at least two orders of magnitude shorter in duration than the first macro etch period; and
    the BPOFF period is at least two orders of magnitude shorter in duration than the second macro etch period.

16. The method of claim 15, wherein the BPON period of one of the micro etch cycles is less than 45% of the BPOFF period.

17. The method of claim 15, wherein the BPON period of one of the micro etch cycles is between about 10% and about 45% of the BPOFF period.

18. The method of claim 15, wherein the plurality of macro etch cycles includes a first macro etch cycle occurring prior to a second macro etch cycle, and wherein a BPON period of one of the micro etch cycles of the first macro etch cycle is greater than a BPON period of one of the micro etch cycles of the second macro etch cycle.

19. The method of claim 15, wherein a frequency of the macro etch cycles of the plurality of macro etch cycles decreases as the substrate is etched.

20. A plasma etch chamber comprising a chamber body having an interior volume;
    a substrate support disposed in the interior volume of the chamber body, the substrate support configured to retain a substrate thereon during processing, the substrate support having an electrode;
    a bias power control system coupled to the electrode;
    a gas panel configured to provide a processing gas to the interior volume; and
    a controller configured to:
        maintain a plasma within the processing chamber formed from the processing gas; and apply a voltage waveform to the electrode while the substrate disposed on the substrate support is exposed to the plasma during a plurality of macro etch cycles, each macro etch cycle including a first macro etch period and a second macro etch period, the macro etch period comprises a plurality of micro etch cycles, each micro etch cycle having a bias power on (BPON) period and a bias power off (BPOFF) period, a duration of the BPON period being less than a duration of the BPOFF period, and bias power is predominantly not applied to the electrode during the second macro etch period.

\* \* \* \* \*